(12) United States Patent
Kuo et al.

(10) Patent No.: US 8,692,318 B2
(45) Date of Patent: Apr. 8, 2014

(54) TRENCH MOS STRUCTURE AND METHOD FOR MAKING THE SAME (75) Inventors: Chin-Te Kuo, New Taipei (TW); Yi-Nan Chen, Taipei (TW); Hsien-Wen Liu, Taoyuan County (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 13/104,924

(22) Filed: May 10, 2011

(65) Prior Publication Data

US 2012/0286352 A1 Nov. 15, 2012

(51) Int. Cl.
H01L 29/66 (2006.01)

(52) U.S. Cl.
USPC ........... 257/330; 257/168; 257/339; 257/409; 257/487; 438/140; 438/319; 438/421; 438/422

(58) Field of Classification Search
USPC ................. 438/140, 319, 421–422; 257/168, 257/330–339, 487, 409
See application file for complete search history.

(56) References Cited

U.S. PATENT DOCUMENTS

| | | | | |
|---|---|---|---|---|
| 4,475,120 A * | 10/1984 | Binet | | 257/522 |
| 4,857,982 A * | 8/1989 | Forrest | | 257/186 |
| 5,216,266 A * | 6/1993 | Ozaki | | 257/302 |
| 5,915,180 A * | 6/1999 | Hara et al. | | 438/270 |
| 7,372,103 B2 * | 5/2008 | Zundel et al. | | 257/330 |
| 7,592,650 B2 * | 9/2009 | Hshieh | | 257/226 |
| 7,821,014 B2 * | 10/2010 | Yonezawa et al. | | 257/77 |
| 7,855,453 B2 * | 12/2010 | Yoshida et al. | | 257/737 |
| 7,923,774 B2 * | 4/2011 | Bhalla et al. | | 257/330 |
| 8,067,800 B2 * | 11/2011 | Hsieh | | 257/331 |
| 8,105,903 B2 * | 1/2012 | Hsieh | | 438/270 |
| 8,120,100 B2 * | 2/2012 | Lin et al. | | 257/330 |
| 8,148,773 B2 * | 4/2012 | Hsieh | | 257/327 |
| 8,187,939 B2 * | 5/2012 | Tai et al. | | 438/270 |
| 8,373,225 B2 * | 2/2013 | Hsieh | | 257/331 |
| 2006/0131647 A1 * | 6/2006 | Meyer | | 257/335 |
| 2006/0209887 A1 * | 9/2006 | Bhalla et al. | | 370/466 |
| 2006/0226498 A1 * | 10/2006 | Davies | | 257/409 |
| 2006/0270154 A1 * | 11/2006 | Yamazaki | | 438/253 |
| 2006/0278924 A1 * | 12/2006 | Kao | | 257/339 |
| 2007/0210316 A1 * | 9/2007 | Yonezawa et al. | | 257/77 |
| 2008/0164518 A1 * | 7/2008 | Darwish | | 257/331 |
| 2008/0164520 A1 * | 7/2008 | Darwish | | 257/334 |
| 2008/0166845 A1 * | 7/2008 | Darwish | | 438/270 |
| 2008/0179662 A1 * | 7/2008 | Hshieh | | 257/328 |
| 2008/0246082 A1 * | 10/2008 | Hshieh | | 257/333 |
| 2009/0203186 A1 * | 8/2009 | Sakagami | | 438/423 |
| 2009/0267140 A1 * | 10/2009 | Hsieh | | 257/328 |
| 2009/0289325 A1 * | 11/2009 | Wang et al. | | 257/510 |
| 2010/0258856 A1 * | 10/2010 | Hsieh | | 257/328 |

(Continued)

Primary Examiner — Alexander Sofocleous
Assistant Examiner — Ankush Singal
(74) Attorney, Agent, or Firm — Winston Hsu; Scott Margo (57) ABSTRACT A trench MOS structure is provided. The trench MOS structure includes a substrate, an epitaxial layer, a trench, a gate isolation, a trench gate, a guard ring and a reinforcement structure within the guard ring. The substrate has a first conductivity type, a first side and a second side opposite to the first side. The epitaxial layer has the first conductivity type and is disposed on the first side. The trench is disposed in the epitaxial layer. The gate isolation covers the inner wall of the trench. The trench gate is disposed in the trench and has the first conductivity type. The guard ring has a second conductivity type and is disposed within the epitaxial layer. The reinforcement structure has an electrically insulating material and is disposed within the guard ring.

19 Claims, 7 Drawing Sheets

(56) References Cited

U.S. PATENT DOCUMENTS

| | | | |
|---|---|---|---|
| 2010/0258899 A1* | 10/2010 | Huang et al. | 257/484 |
| 2010/0285646 A1* | 11/2010 | Lin et al. | 438/270 |
| 2010/0289059 A1* | 11/2010 | Hsieh | 257/140 |
| 2011/0018085 A1* | 1/2011 | An et al. | 257/437 |
| 2011/0045664 A1* | 2/2011 | Davies | 438/524 |
| 2011/0175205 A1* | 7/2011 | Morii et al. | 257/618 |
| 2011/0220998 A1* | 9/2011 | Darwish et al. | 257/339 |
| 2012/0037954 A1* | 2/2012 | Hshieh | 257/139 |
| 2012/0056262 A1* | 3/2012 | Saito et al. | 257/330 |
| 2012/0086073 A1* | 4/2012 | Akiyama et al. | 257/330 |
| 2012/0161226 A1* | 6/2012 | Darwish | 257/330 |

* cited by examiner

TRENCH MOS STRUCTURE AND METHOD FOR MAKING THE SAME

BACKGROUND OF THE INVENTION

1. Field of the Invention

The present invention relates to a trench MOSFET structure with a guard ring and the method for manufacturing the same, and more particularly to a structure of a trench MOSFET which solves a problem of low breakdown voltage in trench gate area and the method for manufacturing the same.

2. Description of the Prior Art

In the structure of a trench Metal-Oxide-Semiconductor Field Effect Transistor (MOSFET) or vertical transistor, the gate of the transistor is formed in a trench on top of a substrate and the source/drain regions are formed on both sides of the gate. This type of vertical transistor allows high current to pass through and channel to be turned on/off at a low voltage.

However, such structure is known to have low breakdown voltage occurring on the trench bottom. When reverse bias between the drain and gate/source increases, avalanche will first occur on the trench bottom of the trenched contact gate.

One possible solution to the above problem is to construct a doped region, called a guard ring. The trench MOS device is as a result protected by the native bias of different doping regions. Another approach is to construct a thick field oxide and N+ epitaxial region for the formation of the guard ring. In one aspect, the protection of the guard ring is not adequate. In another aspect, the formation of the thick field oxide requires additional steps.

SUMMARY OF THE INVENTION

The present invention in a first aspect proposes a new structure of a trench MOS to increase the break down voltage of a trench MOS structure in the presence of a high bias. The new structure of the trench MOS has a novel guard ring surrounding the trench gate to increase the break down voltage.

The trench MOS structure of the present invention includes a substrate, an epitaxial layer, a trench, a gate isolation, a trench gate, a source, a drain, a guard ring and a reinforcement structure within the guard ring. The substrate has a first conductivity type, a first side and a second side opposite to the first side. The epitaxial layer has the first conductivity type and is disposed on the first side. The trench is disposed in the epitaxial layer. The gate isolation covers the inner wall of the trench. The trench gate is disposed in the trench, has the first conductivity type and a first depth. The source has the first conductivity type, is disposed within the epitaxial layer and adjacent to the gate. The guard ring has a second conductivity type, is disposed within the epitaxial layer and adjacent to the source. The reinforcement structure has a second depth and an electrically insulating material and is disposed within the guard ring. The drain is disposed on the second side.

In one embodiment of the present invention, the gate isolation and the electrically insulating material include an oxide.

In another embodiment of the present invention, the second depth is greater than the first depth.

In another embodiment of the present invention, the reinforcement structure includes a reinforcement trench, a reinforcement isolation and a reinforcement material. The reinforcement trench is disposed in the epitaxial layer. The reinforcement isolation has the electrically insulating material and covers the inner wall of the reinforcement trench. The reinforcement material fills the reinforcement trench.

In another embodiment of the present invention, the trench gate has the reinforcement material too.

In one embodiment of the present invention, the reinforcement material is air.

The present invention in a second aspect proposes a method for forming a trench MOS structure. The method is in particular compatible with the current manufacturing processes for the trench MOS structure. First, a substrate and an epitaxial layer are provided. The substrate has a first conductivity type, a first side and a second side opposite to the first side. The epitaxial layer has the first conductivity type and is disposed on the first side. Second, an implantation step is carried out to form at least one region of a second conductivity type disposed within the epitaxial layer to form a guard ring. Then, an etching step is carried out to form a gate trench of a first depth and a reinforcement trench of a second depth. The gate trench and the reinforcement trench are disposed in the epitaxial layer. Next, an oxidizing step is carried out to form a gate isolation covering the inner wall of the gate trench and to form a reinforcement isolation covering the inner wall of the reinforcement trench. Later, the gate trench and the reinforcement trench are filled with a material of the first conductivity type so that the reinforcement trench becomes a reinforcement structure disposed within the guard ring.

In one embodiment of the present invention, the implantation step is carried out before the etching step.

In another embodiment of the present invention, the implantation step is carried out after the etching step.

In another embodiment of the present invention, the opening of the gate trench is larger than that of the reinforcement trench.

In another embodiment of the present invention, the second depth is greater than the first depth.

In another embodiment of the present invention, the material completely fills up the gate trench and the reinforcement trench.

In another embodiment of the present invention, the material seals the reinforcement trench to form an air gap.

These and other objectives of the present invention will no doubt become obvious to those of ordinary skill in the art after reading the following detailed description of the preferred embodiment that is illustrated in the various figures and drawings.

DETAILED DESCRIPTION

The present invention in a first aspect provides a method for forming a trench MOS structure which has a reinforcement structure disposed within a guard ring to substantially raise the breakdown voltage of the trench MOS structure. FIGS. 1-4 illustrate the method for forming the trench MOS structure with the reinforcement structure. Please refer to FIG. 1, first, a substrate 101 and an epitaxial layer 110 are provided. The substrate 101 may be a semiconductive material, such as Si and has a first side 102 and a second side 103. The second side 103 is opposite to the first side 102. In addition, substrate 101 may have a first conductivity type, such as a P type or an N type, for example, an N+ type. The epitaxial layer 110 is disposed on the first side 102 of the substrate 101. The epitaxial layer 110 also has the first conductivity type, such as the P type or the N type, for example, an N+ type.

Figure 1:
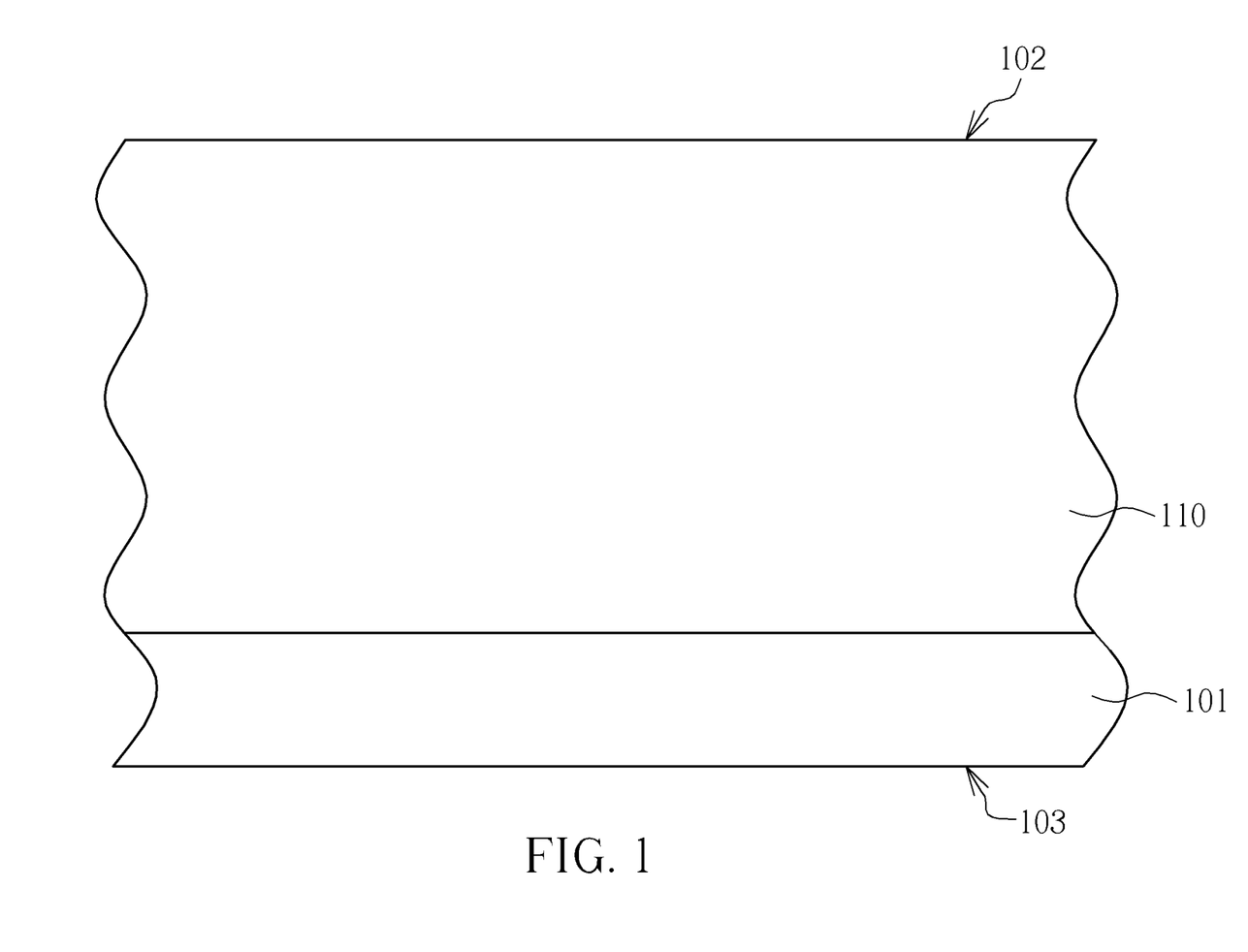
FIGS. 1-4 illustrate the method for forming the trench MOS structure with the reinforcement structure of the present invention.
Figure 2A:
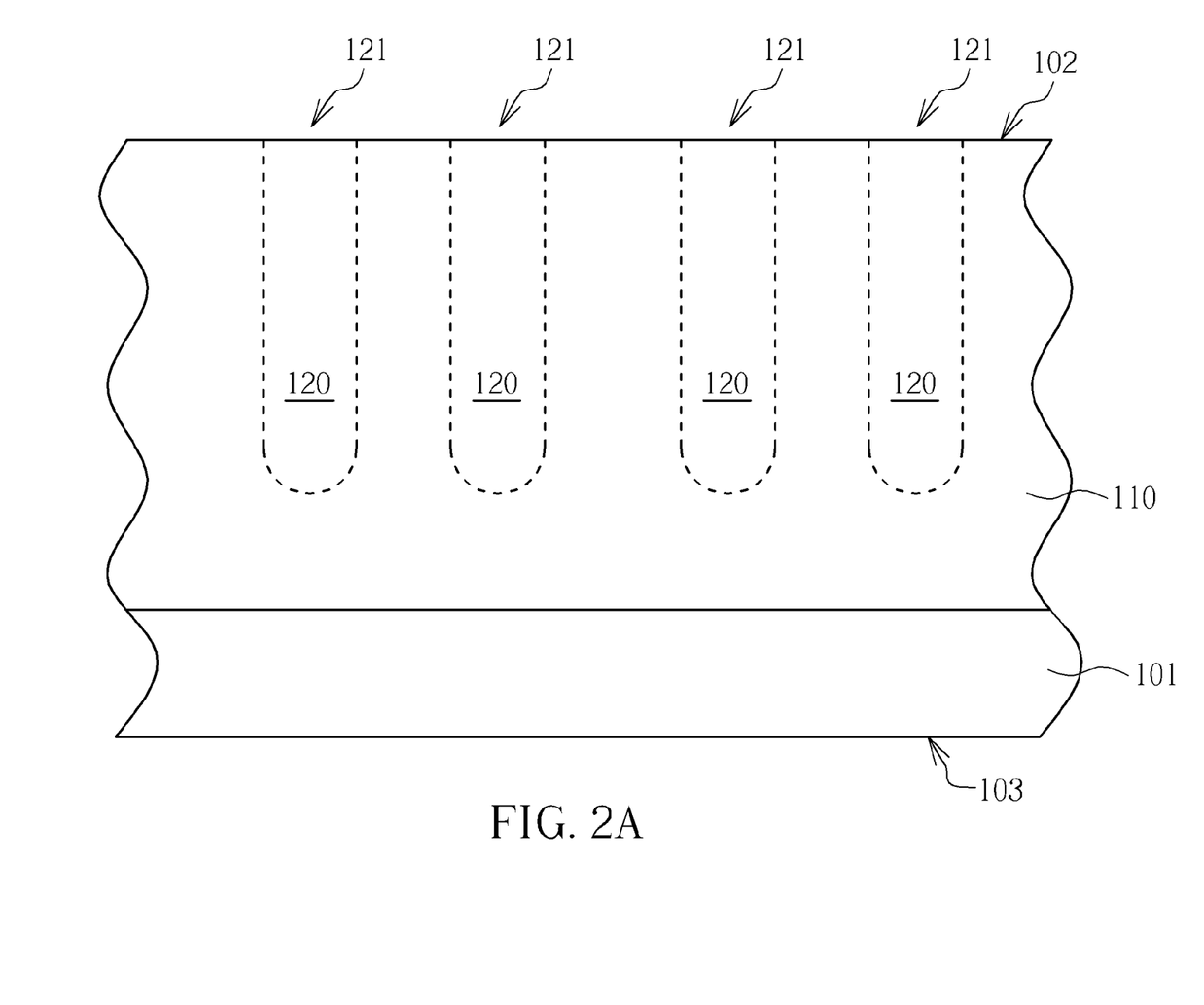
Figure 2B:
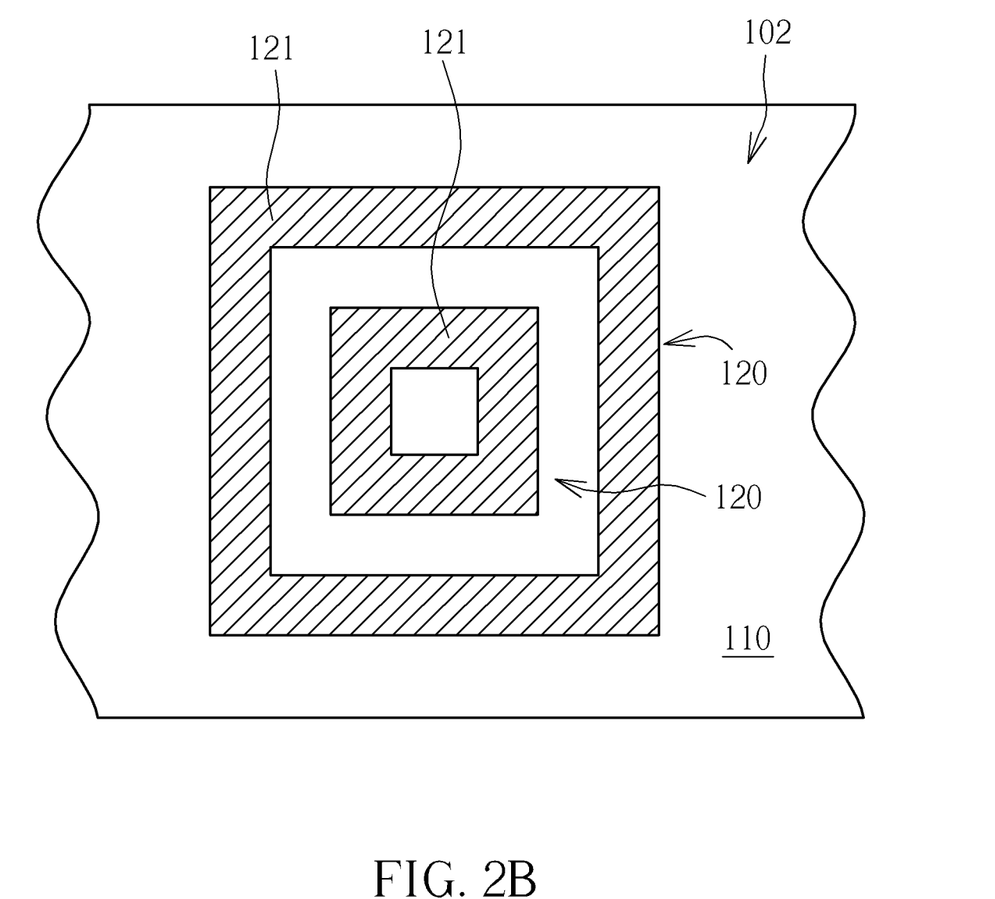

Second, please refer to FIG. 2A, an implantation step is carried out from the first side 102 to form at least one region 120, or multiple regions 120, of a second conductivity type, such as a P type or an N type, for example, a P– type. However, the first conductivity type and the second conductivity are different. FIG. 2B is a top view of the multiple regions 120 as illustrated in FIG. 2A. The regions 120 may be rectangular and disposed within the epitaxial layer 110 to form one or more guard rings 121.

Figure 3:
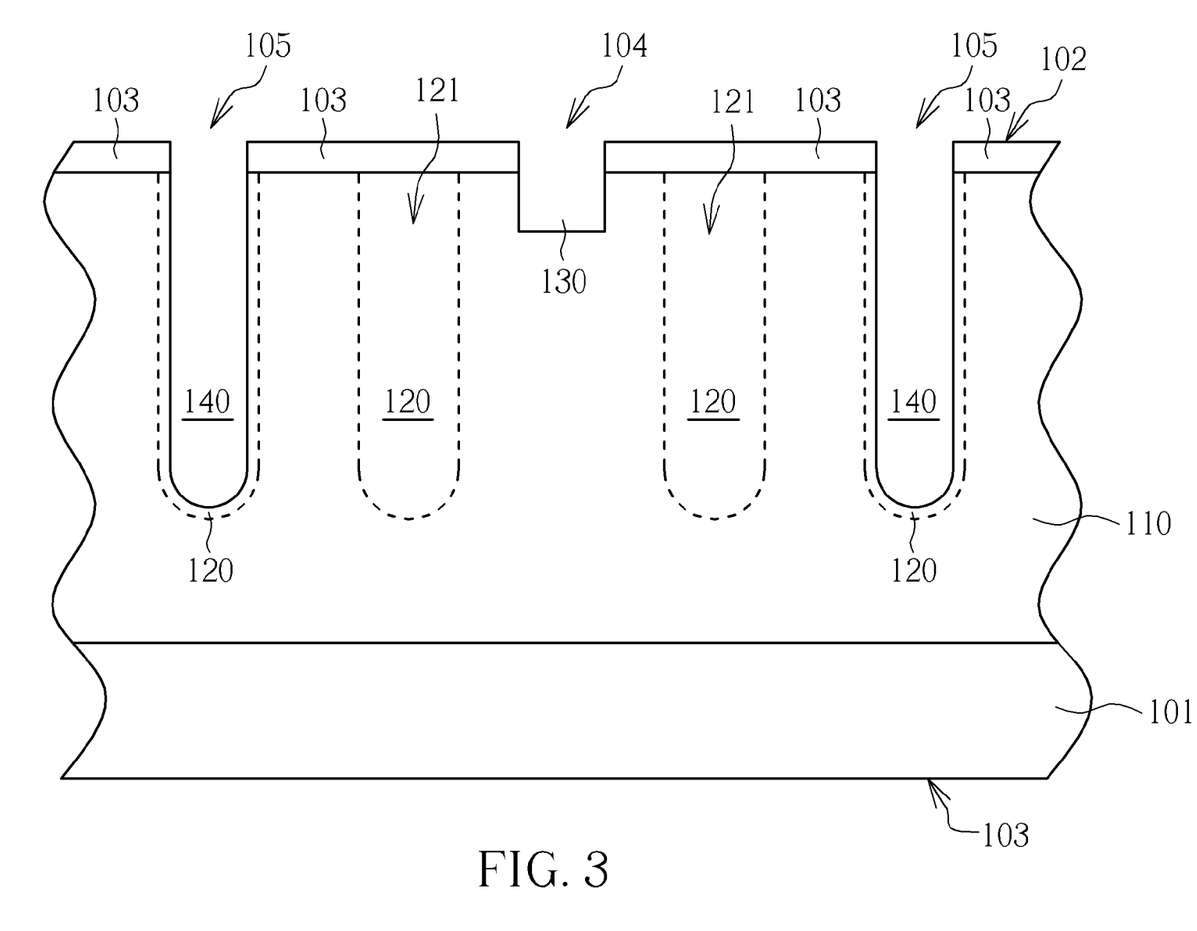

Then, as shown in FIG. 3, an etching step, such as a dry etching step, is carried out to respectively form a gate trench 130 of a first depth and a reinforcement trench 140 of a second depth at the same time. The gate trench 130 and the reinforcement trench 140 are all disposed in the epitaxial layer 110 but they may have different depths. In one embodiment of the present invention, the second depth of the reinforcement trench 140 is greater than the first depth of the gate trench 130.

One feature of the method for forming a trench MOS structure of the present invention resides in that there is an additional reinforcement trench 140 which surrounds the gate trench 130 and is disposed within at least one of the guard rings 121. Another feature of the method for forming a trench MOS structure of the present invention resides in that the gate trench 130 and the reinforcement trench 140 are formed by the same etching step to exhibit a process compatibility. The depth of the reinforcement trench 140 and the gate trench 130 may be controlled by the opening sizes of them.

Generally speaking, a larger opening results in a greater depth. For example, a patterned mask 103 may be used to define the gate trench 130 and the reinforcement trench 140 of different depths. The patterned mask 103 may have a first opening 104 for defining the gate trench 130 and a second opening 105 for defining the reinforcement trench 140. Preferably, the second opening 104 is larger than the first opening 104. After the etching step is complete, the patterned mask 103 may be removed.

Optionally, the etching step and the implantation step may be carried out in a desirable sequence. For example, the implantation step may be carried out before the etching step. Alternatively, the implantation step may be carried out after the etching step. FIG. 3 illustrates the etching step is carried out after the implantation step.

Figure 4:
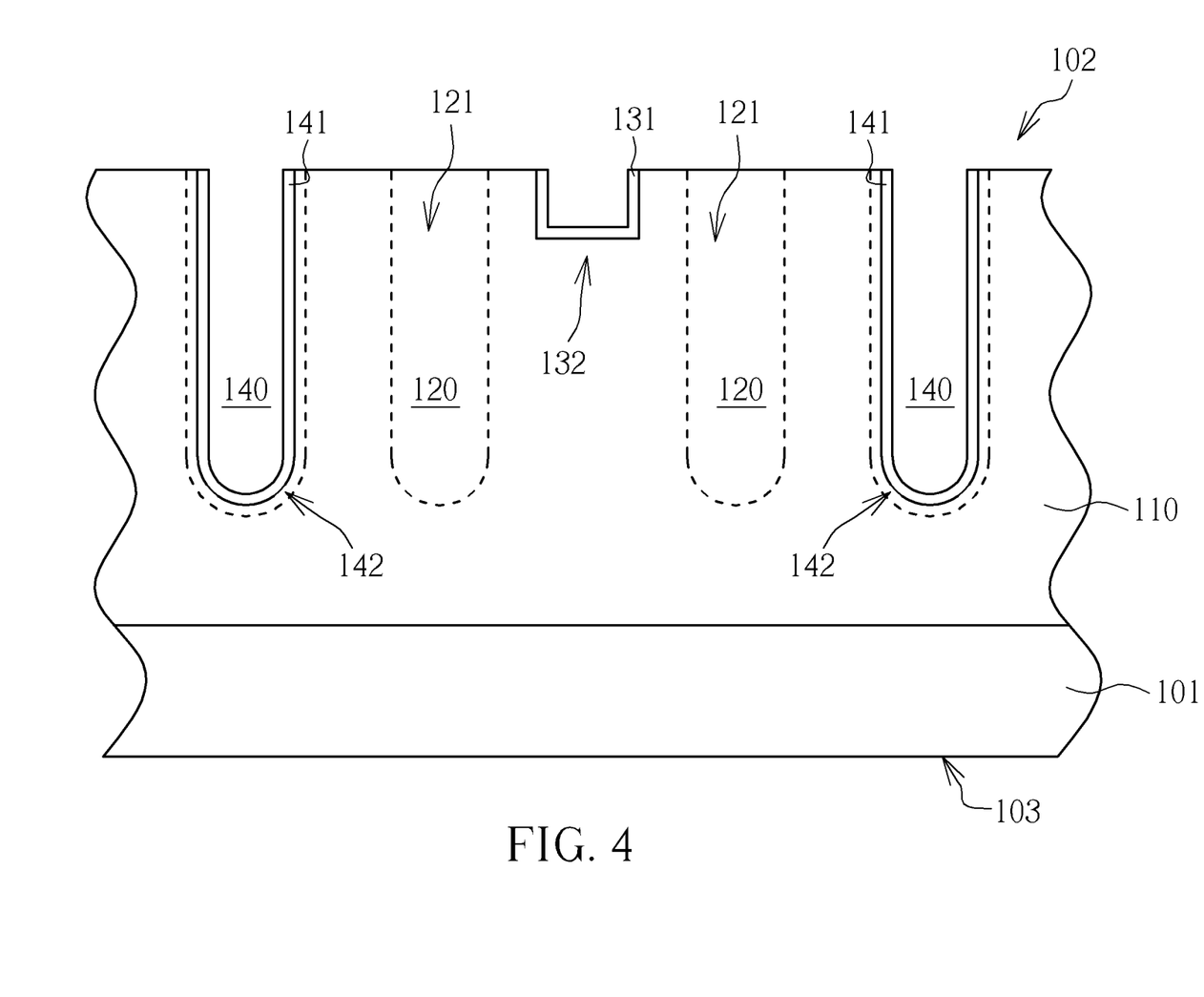

Next, as shown in FIG. 4, an oxidizing step is carried out. The oxidizing step may form an oxide, such as a gate isolation 131 to cover the inner wall 132 of the gate trench 130 and to form a reinforcement isolation 141 to cover the inner wall 142 of the reinforcement trench 140. The oxidizing step may be a dry oxidation step. The gate isolation 131 may have a thickness around 50 nm and the reinforcement isolation 141 may have a thickness around 52 nm. In particular, the gate isolation 131 serves as a basic structure to increase the breakdown voltage of the final structure, and the reinforcement isolation 141 serves as an enhanced structure to increase the breakdown voltage of the final structure. Another feature of the method for forming a trench MOS structure of the present invention resides in that the gate isolation 131 and the reinforcement isolation 141 are formed by the same oxidizing step to exhibit a process compatibility.

Figure 5A:
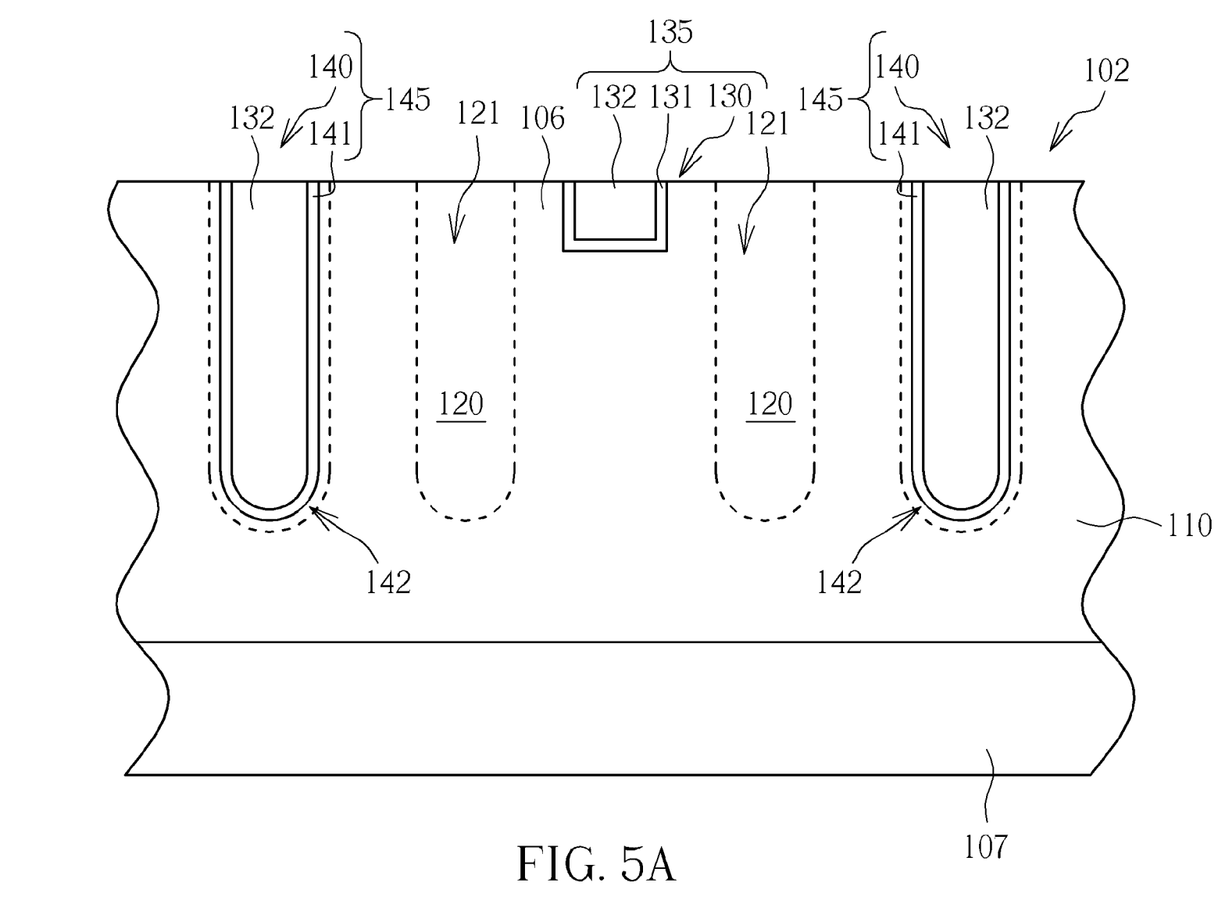
FIG. 5A and FIG. 5B respectively illustrate a trench MOS structure of the present invention.

Later, as shown in FIG. 5A, the gate trench 130 and the reinforcement trench 140 are filled with a material of the first conductivity type at the same time to obtain a trench MOS structure 100. The material, such as a gate conductor 132 may be a doped Si, such as N+ type and formed by an in-situ doping poly procedure. After this, the gate trench 130, the gate isolation 131 and the gate conductor 132 together form a trench gate 135. Furthermore, the reinforcement trench 140 and the reinforcement isolation 141 become a reinforcement structure 145. The reinforcement structure 145 is disposed entirely within the guard ring 121.

Figure 5B:
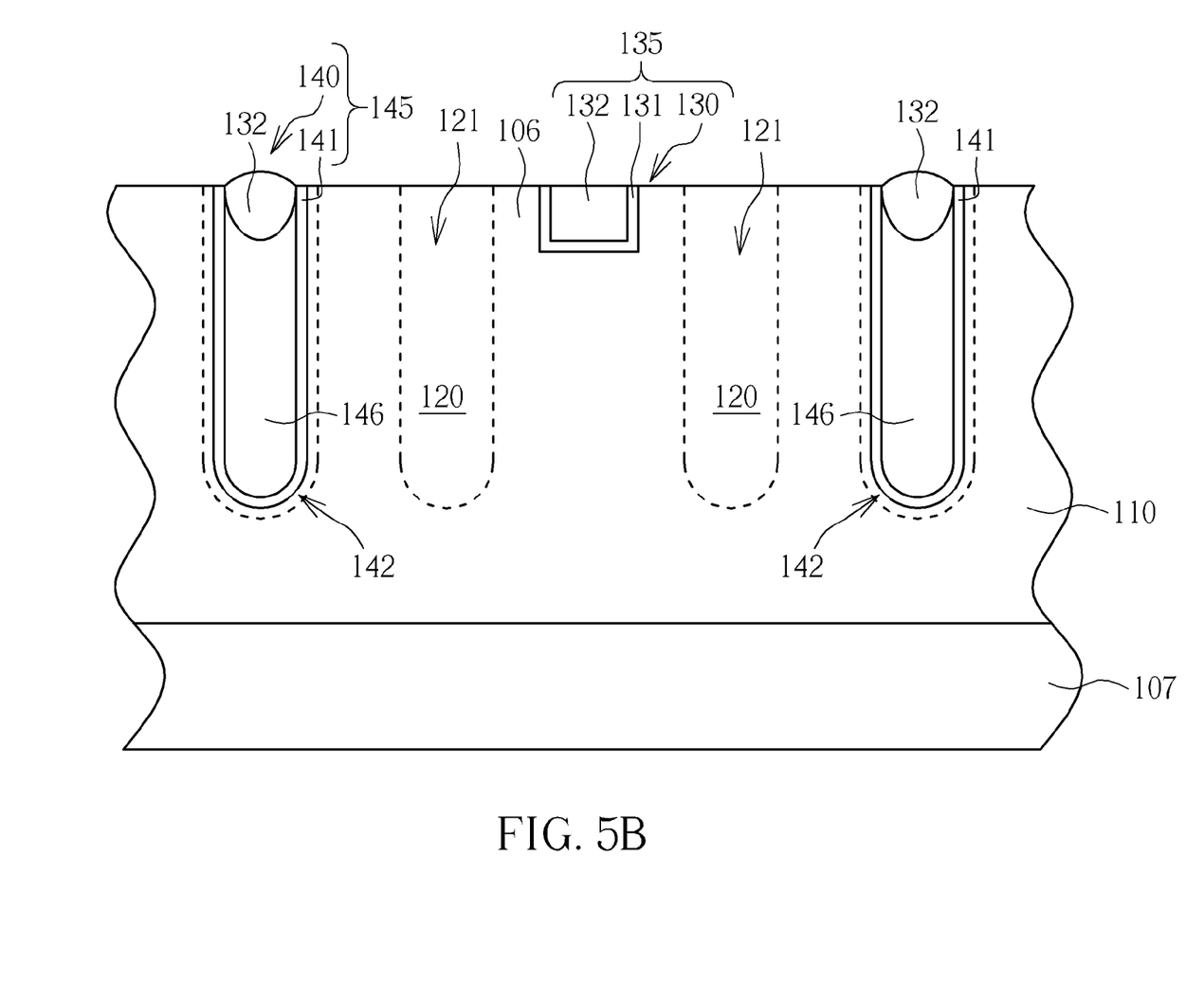

In one embodiment of the present invention as shown in FIG. 5A, the material may completely fill up the gate trench 130 and the reinforcement trench 140 if the openings are large enough. In another embodiment of the present invention as shown in FIG. 5B, the material may seal the opening of the reinforcement trench 140 to form an air gap 146. The air gap 146 may further help to increase the breakdown voltage of the trench MOS structure 100.

After the above-mentioned steps, a trench MOS structure 100 is obtained. As shown in either FIG. 5A or FIG. 5B, the trench MOS structure 100 of the present invention includes a substrate 101, an epitaxial layer 110, a trench 130, a gate isolation 131, a trench gate 135, a source 106, a drain 107, a guard ring 121 and a reinforcement structure 145. The substrate 101 may be a semiconductive material, such as Si and has a first side 102 and a second side 103. The second side 103 is opposite to the first side 102. In addition, the substrate 101 may have a first conductivity type, such as a P type or an N type, for example, an N+ type. The epitaxial layer 110 is disposed on the first side 102 of the substrate 101 to accommodate the source 106 which is adjacent to the trench gate 135. The epitaxial layer 110 also has the first conductivity type, such as the P type or the N type, for example, an N+ type. The drain 107 is disposed on the second side 103 of the substrate 101.

The trench 130 is disposed in the epitaxial layer 110 to accommodate the gate isolation 131, such as an oxide, and the gate conductor 132 to form the trench gate 135. The gate isolation 131 covers the inner wall 132 of the trench 130. The trench gate 135 is disposed in the trench 130, and includes a gate conductor 132 such as a doped Si of an N+ type and a first depth, for example 50 nm.

The guard ring 121 is formed by at least one doping region 120 and has a second conductivity type, such as a P type or an N type, for example, a P– type. However, the first conductivity type and the second conductivity are different. The guard ring 121 may be a single or double rectangular and is disposed within the epitaxial layer 110 and adjacent to the source 106, as shown in FIG. 2B. The guard ring 121 protects the trench MOS structure 100 by a nature bias.

The reinforcement structure 145 has a second depth, for example 60 nm and is disposed entirely within the guard ring 121. In one embodiment of the present invention, the second depth of the reinforcement trench 140 is greater than the first depth of the gate trench 130. The reinforcement structure 145 includes reinforcement trench 140, an electrically insulating material as a reinforcement isolation 141, such as an oxide, covering the inner wall 142 of the reinforcement trench 140, and a gate conductor 132 such as a doped Si of an N+ type. The reinforcement isolation 141 serves as an enhanced structure to increase the breakdown voltage of the trench MOS structure 100.

In one embodiment of the present invention, the reinforcement structure includes a reinforcement material. In one aspect, the reinforcement material, such as the same as the gate conductor 132, fills the reinforcement trench 140. In another aspect, the reinforcement material may be air 147 to form an air gap 146 as, shown in FIG. 5B. The air gap 146 may further help to increase the breakdown voltage of the trench MOS structure 100.

Those skilled in the art will readily observe that numerous modifications and alterations of the device and method may be made while retaining the teachings of the invention.

What is claimed is:

1. A trench MOS structure, comprising:
   a substrate of a first conductivity type and having a first side and a second side opposite to said first side;
   an epitaxial layer of said first conductivity type disposed on said first side;
   a trench disposed in said epitaxial layer;
   a gate isolation covering an inner wall of said trench;
   a trench gate disposed in said trench, of said first conductivity type, and of a first depth;
   a source of said first conductivity type, disposed within said epitaxial layer and adjacent to said trench gate;
   a guard ring of a second conductivity type disposed within said epitaxial layer and adjacent to said source so that said source is directly sandwiched between said guard ring and said trench gate;
   a reinforcement structure of a second depth having an electrically insulating material and disposed within said guard ring; and
   a drain disposed on said second side.

2. The trench MOS structure of claim 1, wherein said first conductivity type is N type.

3. The trench MOS structure of claim 1, wherein said first conductivity type is P type.

4. The trench MOS structure of claim 1, wherein said gate isolation and said electrically insulating material comprises oxide.

5. The trench MOS structure of claim 1, wherein said trench gate comprises poly-silicon of said first conductivity type.

6. The trench MOS structure of claim 1, wherein said second depth is greater than said first depth.

7. The trench MOS structure of claim 1, wherein said source is adjacent to said guard ring.

8. The trench MOS structure of claim 1, wherein said reinforcement structure comprises:
   a reinforcement trench disposed in said epitaxial layer;
   a reinforcement isolation of said electrically insulating material and covering an inner wall of said reinforcement trench; and
   a reinforcement material filling said reinforcement trench.

9. The trench MOS structure of claim 8, wherein said trench gate has said reinforcement material.

10. The trench MOS structure of claim 8, wherein said reinforcement material is air.

11. A method for forming a trench MOS structure, comprising:
    providing a substrate and an epitaxial layer, wherein said substrate has a first conductivity type, a first side and a second side opposite to said first side, and said epitaxial layer of said first conductivity type is disposed on said first side and has a source disposed within said epitaxial layer;
    performing an implantation step to form at least one region of a second conductivity type disposed within said epitaxial layer to form a guard ring;
    performing an etching step to form a gate trench of a first depth and a reinforcement trench of a second depth, wherein said gate trench and said reinforcement trench are disposed in said epitaxial layer and of different functions;
    performing an oxidizing step to form a gate isolation covering an inner wall of said gate trench and to form a reinforcement isolation covering an inner wall of said reinforcement trench and serving as an enhanced structure to increase the breakdown voltage of the trench MOS structure; and
    filling said gate trench and said reinforcement trench with a material of said first conductivity type so that said reinforcement trench becomes a reinforcement structure disposed within said guard ring as well as said source is directly sandwiched between said guard ring and said gate trench.

12. The method for forming a trench MOS structure of claim 11, wherein said first conductivity type is N type.

13. The method for forming a trench MOS structure of claim 11, wherein said first conductivity type is P type.

14. The method for forming a trench MOS structure of claim 11, wherein said implantation step is performed before said etching step.

15. The method for forming a trench MOS structure of claim 11, wherein said implantation step is performed after said etching step.

16. The method for forming a trench MOS structure of claim 11, wherein an opening of said gate trench is larger than that of said reinforcement trench.

17. The method for forming a trench MOS structure of claim 11, wherein said second depth is greater than said first depth.

18. The method for forming a trench MOS structure of claim 11, wherein said material completely fills up said gate trench and said reinforcement trench.

19. The method for forming a trench MOS structure of claim 11, wherein said material seals said reinforcement trench to form an air gap.

* * * * *